United States Patent
Kasai et al.

(10) Patent No.: US 7,508,114 B2
(45) Date of Patent: Mar. 24, 2009

(54) ULTRASONIC MOTOR

(75) Inventors: Yasuaki Kasai, Tokyo (JP); Makoto Harada, Tokyo (JP)

(73) Assignee: Olympus Corporation, Tokyo (JP)

(*) Notice: Subject to any disclaimer, the term of this patent is extended or adjusted under 35 U.S.C. 154(b) by 389 days.

(21) Appl. No.: 11/371,517

(22) Filed: Mar. 8, 2006

(65) Prior Publication Data
US 2006/0202589 A1    Sep. 14, 2006

(30) Foreign Application Priority Data
Mar. 11, 2005    (JP)    ............... 2005-069303

(51) Int. Cl.
*H01L 41/09*    (2006.01)
(52) U.S. Cl. .............................. 310/323.16
(58) Field of Classification Search ............ 310/323.05, 310/323.09, 323.06, 328, 323.02, 316.01–2, 310/323.12, 323.01, 366, 365; 359/819, 359/824; *H01L 41/08, 41/09*
See application file for complete search history.

(56) References Cited

U.S. PATENT DOCUMENTS 7,205,703 B2 *    4/2007    Funakubo et al. ...... 310/323.02

2005/0067922 A1 *    3/2005    Sasaki et al. ............ 310/323.09
2006/0202589 A1 *    9/2006    Kasai et al. ............. 310/323.13
2008/0030101 A1 *    2/2008    Funakubo ............... 310/316.02

FOREIGN PATENT DOCUMENTS

JP    2001-258277    9/2001

* cited by examiner

*Primary Examiner*—Thomas M. Dougherty
*Assistant Examiner*—Karen B Addison
(74) *Attorney, Agent, or Firm*—Scully, Scott, Murphy & Presser, P.C.

(57) ABSTRACT

It is an object to provide an ultrasonic motor that can stably and finely (that is, minutely) move a driven body. The invention provides an ultrasonic motor comprising an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and a pressing unit for pressing the output terminals of the ultrasonic vibrator against a driven body. The output terminals include first friction-contact members disposed at positions substantially corresponding to antinodes of a flexural vibration and a second friction-contact member disposed substantially at the center in the longitudinal direction of the ultrasonic vibrator.

3 Claims, 9 Drawing Sheets

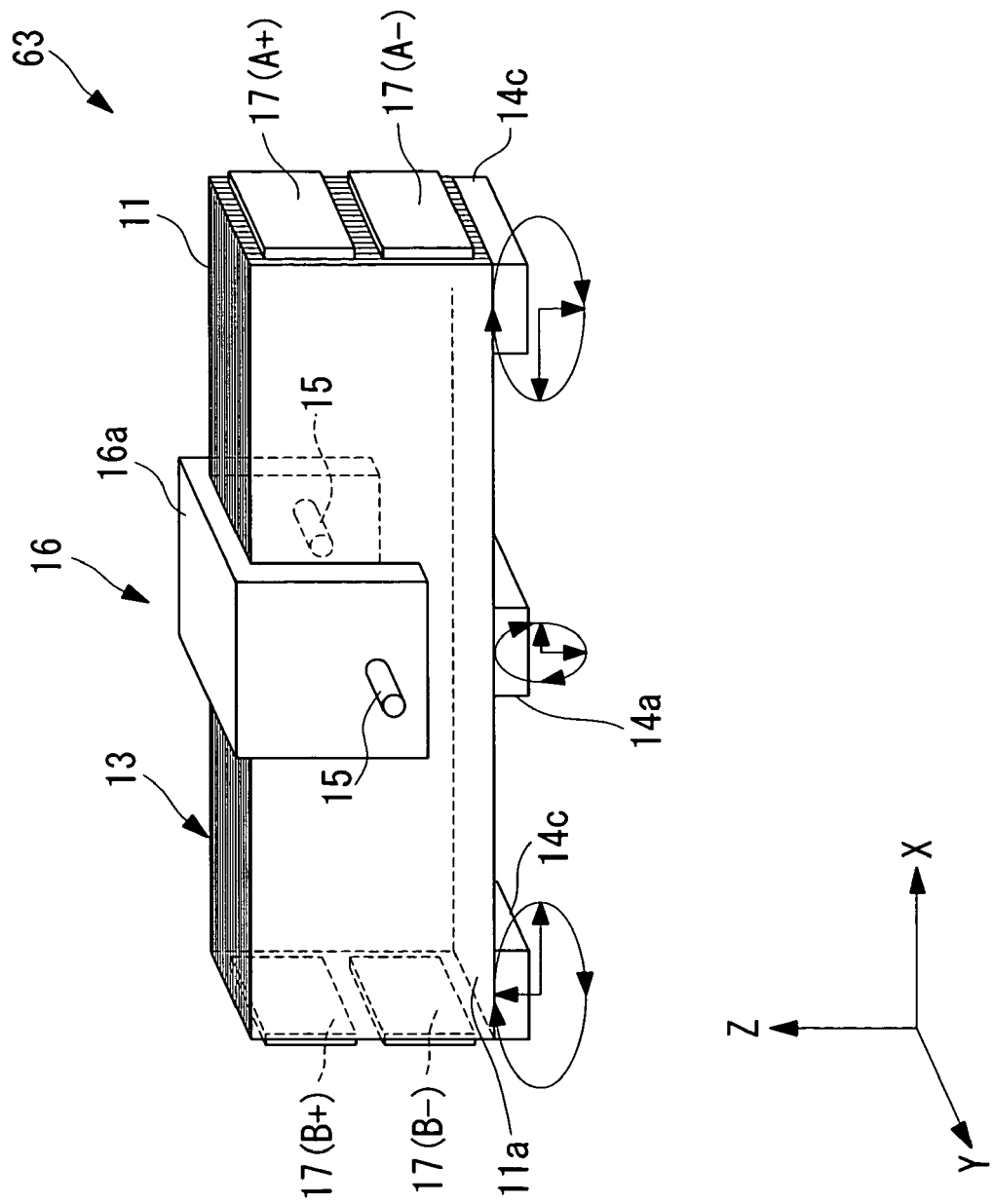

ULTRASONIC MOTOR

BACKGROUND OF THE INVENTION

1. Field of the Invention

The present invention relates to an ultrasonic motor.

2. Description of Related Art

Recently, ultrasonic motors have been drawing attention as a new type of motor replacing electromagnetic motors. Ultrasonic motors have the following advantages over known electromagnetic motors:

1) Ultrasonic motors are capable of high torque without using gears;
2) Ultrasonic motors have holding force when powered off;
3) Ultrasonic motors have high resolution;
4) Ultrasonic motors are quiet; and
5) Ultrasonic motors do not generate magnetic noise and are unaffected by noise.

A known ultrasonic motor is described in Japanese Unexamined Patent Application Publication No. 2001-258277. The ultrasonic motor disclosed in Japanese Unexamined Patent Application Publication No. 2001-258277 has a construction including at least three driving units on the surface of an elastic body opposing a driven body.

With the ultrasonic motor disclosed in Japanese Unexamined Patent Application Publication No. 2001-258277, all of the driving units exhibit circular or elliptical motion in the same directions, and to finely (that is, minutely) move the driven body, it is thus necessary to reduce the vibration amplitude of the circular or elliptical motion. However, it is difficult to control the vibration amplitude of the elastic body while maintaining resonance, and as a result, there is the drawback that it is difficult to achieve stable, fine motion of the driven body.

BRIEF SUMMARY OF THE INVENTION

The present invention has been conceived in light of the circumstances described above, and an object thereof is to provide an ultrasonic motor that is capable of stably and finely (that is, minutely) moving a driven body.

In order to realize the above-described object, the present invention provides the following solutions.

An ultrasonic motor according to a first aspect of the present invention includes an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and a pressing unit for pressing the output terminals of the ultrasonic vibrator against a driven body. The output terminals include first friction-contact members disposed at positions substantially corresponding to antinodes of a flexural vibration and a second friction-contact member disposed substantially at the center in the longitudinal direction of the ultrasonic vibrator.

With the ultrasonic motor according to the first aspect of the invention described above, by supplying two sets of alternating-current voltages with a predetermined phase difference and predetermined driving frequency to the electromechanical transducer, a substantially elliptical vibration in one direction, formed by combining a longitudinal vibration mode and a flexural vibration mode, is generated in the first friction-contact members. The driven body is then driven by the frictional force produced between the ultrasonic vibrator and the driven body in a direction tangential to the elliptical vibration. At this time, the second friction-contact members vibrate substantially elliptically in the opposite direction (other direction) to the first friction-contact members. Thus, a damping force is applied to the driven body driven by the first friction-contact members due to the frictional force produced between the ultrasonic vibrator and the driven body in a direction tangential to the elliptical vibration.

An ultrasonic motor according to a second aspect of the present invention includes an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and a pressing unit for pressing the output terminals of the ultrasonic vibrator against a driven body. The output terminals include first friction-contact members disposed at positions substantially corresponding to antinodes of a flexural vibration and third friction-contact members disposed at two ends in the longitudinal direction of the ultrasonic vibrator.

With the ultrasonic motor according to the second aspect of the invention described above, by supplying two sets of alternating-current voltages with a predetermined phase difference and predetermined driving frequency to the electromechanical transducer, a substantially elliptical vibration in one direction, formed by combining a longitudinal vibration mode and a flexural vibration mode, is generated in the third friction-contact members. The driven body is then driven by the frictional force produced between the ultrasonic vibrator and the driven body in a direction tangential to the elliptical vibration. At this time, the first friction-contact members vibrate substantially elliptically in the opposite direction (other direction) to the third friction-contact members. Thus, a damping force is applied to the driven body driven by the third friction-contact members due to the frictional force produced between the ultrasonic vibrator and the driven body in a direction tangential to the elliptical vibration.

Furthermore, an ultrasonic motor according to a third aspect of the present invention includes an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and a pressing unit for pressing the output terminals of the ultrasonic vibrator against a driven body. The output terminals include first friction-contact members disposed at positions substantially corresponding to antinodes of a flexural vibration and a third friction-contact member disposed at one end in the longitudinal direction of the ultrasonic vibrator.

With the ultrasonic motor according to the third aspect of the invention described above, by supplying two sets of alternating-current voltages with a predetermined phase difference and predetermined driving frequency to the electromechanical transducer, a substantially elliptical vibration in one direction, formed by combining a longitudinal vibration mode and a flexural vibration mode, is generated in the third friction-contact members. The driven body is then driven by the frictional force produced between the ultrasonic vibrator and the driven body in a direction tangential to the elliptical vibration. At this time, the first friction-contact members vibrate substantially elliptically in the opposite direction (other direction) to the third friction-contact members. Thus, a damping force is applied to the driven body driven by the third friction-contact members due to the frictional force produced between the ultrasonic vibrator and the driven body in a direction tangential to the elliptical vibration.

According to the present invention, an advantage is afforded in that it is possible to stably and finely (that is, minutely) move a driven body without having to adjust the amplitudes of substantially elliptical vibrations of a plurality of friction-contact members provided on an electromechanical transducer.

BRIEF DESCRIPTION OF THE SEVERAL VIEWS OF THE DRAWINGS

FIG. 11 is a perspective view showing an ultrasonic vibrator in an ultrasonic motor according to a sixth embodiment of the present invention.

DETAILED DESCRIPTION OF THE INVENTION

An ultrasonic motor according to a first embodiment of the present invention will be described below with reference to FIGS. 1 to 7

Figure 1:
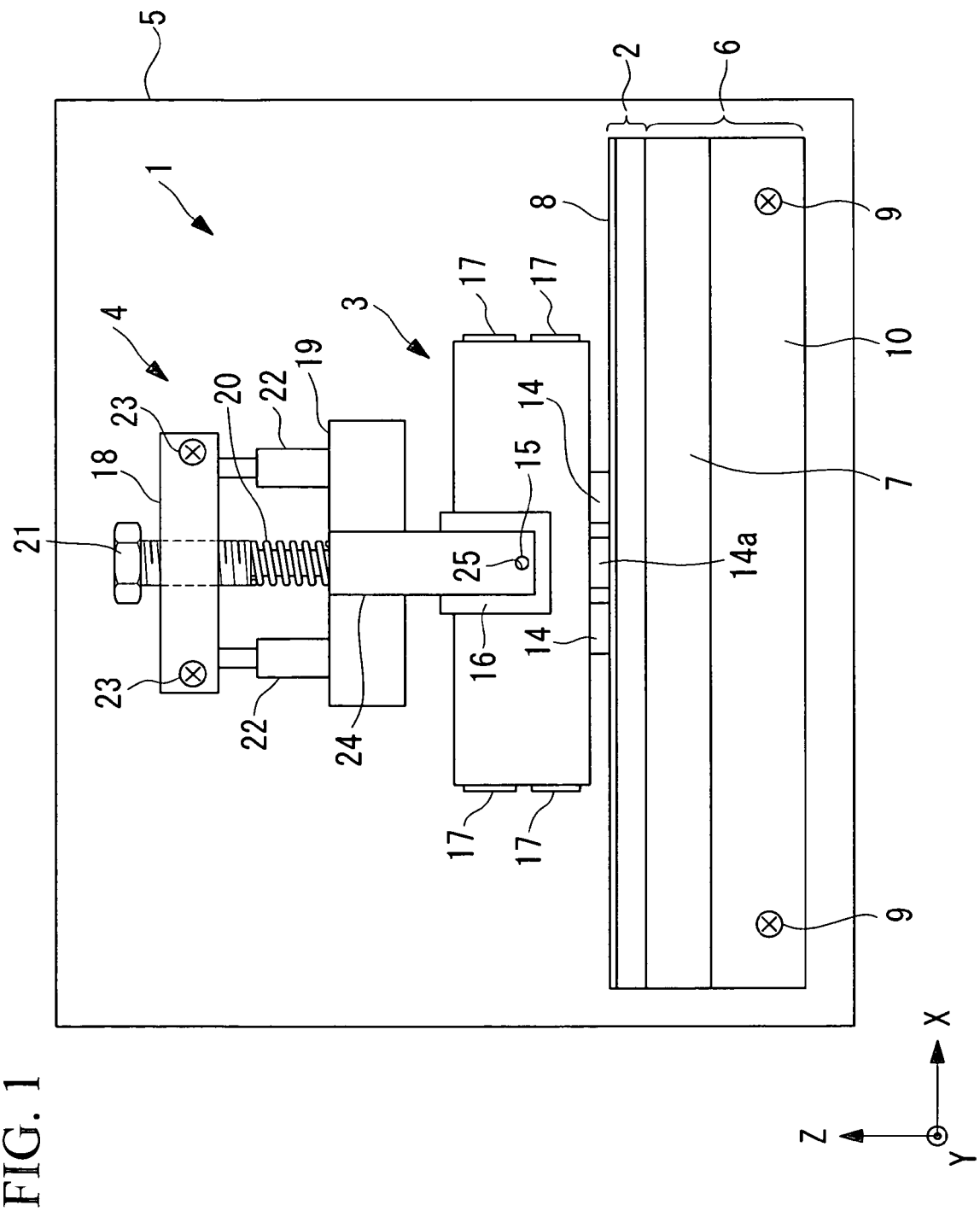
FIG. 1 is an overall schematic diagram showing an ultrasonic motor according to a first embodiment of the present invention.

As shown in FIG. 1, an ultrasonic motor 1 according to this embodiment includes a driven body 2, an ultrasonic vibrator 3 disposed in contact with the driven body 2, and a pressing unit 4 for pressing the ultrasonic vibrator 3 against the driven body 2.

The driven body 2 is fixed to a movable member 7 of a linear bearing 6, which is secured to a base 5. A sliding plate 8 made of, for example, zirconia ceramic is bonded to the driven body 2 on the surface contacting the ultrasonic vibrator 3. Screws 9 secure a fixed member 10 of the linear bearing 6 to the base 5.

As shown in FIGS. 2, 3, 4A and 4B, the ultrasonic vibrator 3 includes a rectangular-block-shaped piezoelectric layered member 13, first friction-contact members (output terminals) 14 and a second friction-contact member (output terminal) 14a bonded to one of the side surfaces of the piezoelectric layered member 13, and a vibrator holding member 16. The piezoelectric layered member 13 is made up of a stack of rectangular piezoelectric ceramic sheets (electromechanical transducers) 11. On one side of each of the piezoelectric ceramic sheets 11, sheets of inner electrodes 12 are provided (refer to FIGS. 4A and 4B). The vibrator holding member 16 has pins 15 projecting from side surfaces adjacent to the side surface on which the friction-contact members 14 and 14a are provided.

Figure 3:
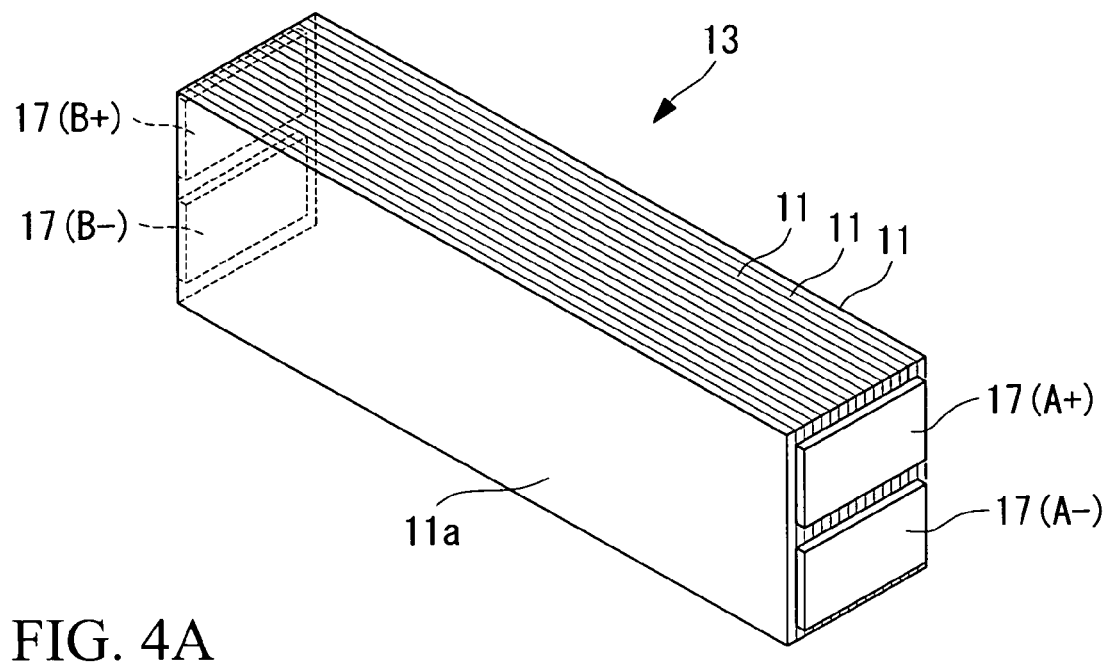
FIG. 3 is a perspective view showing a piezoelectric layered member constituting the ultrasonic vibrator in FIG. 2.

As shown in FIG. 3, the outer dimensions of the piezoelectric layered member 13 are, for example, a length of 18 mm, a width of 4.4 mm, and a thickness of 2 mm.

Figure 4A:
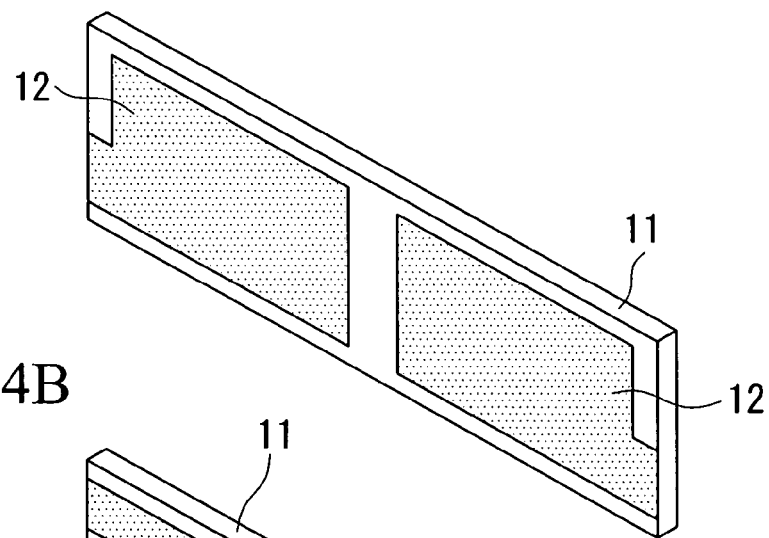
FIG. 4A is a perspective view showing a piezoelectric ceramic sheet constituting the piezoelectric layered member in FIG. 3.
Figure 4B:
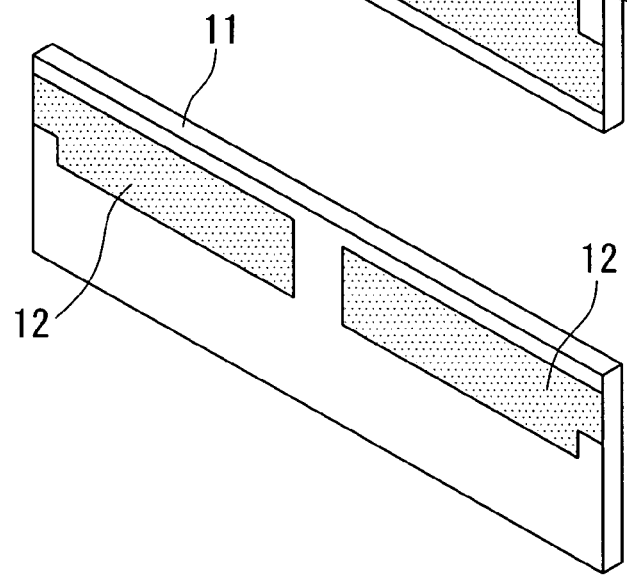
FIG. 4B is a perspective view showing a piezoelectric ceramic sheet constituting the piezoelectric layered member in FIG. 3.

As shown in FIGS. 4A and 4B, the piezoelectric ceramic sheets 11 constituting the piezoelectric layered member 13 are, for example, lead zirconate titanate (hereinafter referred to as PZT) piezoelectric ceramic elements having a thickness of about 80 μm. For the PZT, a hard-type PZT having a large Qm value is selected. The Qm value is about 1,800.

The inner electrodes 12, for example, are composed of silver-palladium alloy and have a thickness of about 4 μm. A piezoelectric ceramic sheet 11a, which is the outermost layer of the stack of piezoelectric ceramic sheets 11, is not provided with the inner electrodes 12. The piezoelectric ceramic sheets 11, except for the piezoelectric ceramic sheet 11a, each include a pair of inner electrodes 12 of one of two different types. The two different types of inner electrodes 12 are illustrated in FIGS. 4A and 4B.

The type of piezoelectric ceramic sheet 11 illustrated in FIG. 4A has the inner electrodes 12 disposed on most of the surface. Two inner electrodes 12 are disposed adjacent to each other in the longitudinal direction with an insulating distance of about 0.4 mm therebetween. The inner electrodes 12 are disposed about 0.4 mm from the edges of the piezoelectric ceramic sheet 11, and portions thereof extend to the edges of the piezoelectric ceramic sheet 11.

The type of piezoelectric ceramic sheet 11 illustrated in FIG. 4B has the inner electrodes 12 disposed in an area corresponding to substantially half of the width of the piezoelectric ceramic sheet 11. Two inner electrodes 12 are disposed adjacent to each other in the longitudinal direction with an insulating distance of about 0.4 mm therebetween. The inner electrodes 12 are disposed about 0.4 mm from the edges of the piezoelectric ceramic sheet 11, and portions thereof extend to the edges of the piezoelectric ceramic sheet 11.

The two different types of piezoelectric ceramic sheets 11 provided with the different-shaped inner electrodes 12 (i.e., the piezoelectric ceramic sheet 11 illustrated in FIG. 4A provided with large inner electrodes 12 and the piezoelectric ceramic sheet 11 illustrated in FIG. 4B provided with small inner electrodes 12) are alternately stacked to form the rectangular piezoelectric layered member 13.

A total of four external electrodes 17 are disposed on the piezoelectric layered member 13, one pair of external electrodes 17 being disposed on each longitudinal end of the piezoelectric layered member 13. The external electrodes 17 are each connected to a group of inner electrodes 12 provided at the same position on the same type of piezoelectric ceramic sheets 11. In this way, the inner electrodes 12 provided at the same position on the same type of piezoelectric ceramic sheets 11 have the same electric potential. The external electrodes 17 have electrical connections that are not shown in the drawings. The electrical connections may be established by any type of flexible wiring material, such as lead wires or flexible substrates.

The piezoelectric layered member 13 is manufactured, for example, as described below.

To manufacture the piezoelectric layered member 13, first, the piezoelectric ceramic sheets 11 are prepared. The piezoelectric ceramic sheets 11 are prepared, for example, by casting a slurry mixture of a calcinated powder of PZT and a predetermined binder onto a film using a doctor blade method, drying the mixture, and removing the dried mixture from the film.

The material for the inner electrodes 12 is printed on each of the prepared piezoelectric ceramic sheets 11 using a mask having a pattern for the inner electrode 12. First, the piezoelectric ceramic sheet 11a with no inner electrode 12 is provided. Then, the two types of piezoelectric ceramic sheets 11 having different-shaped inner electrodes 12 are carefully aligned and alternately stacked on the piezoelectric ceramic sheet 11a with the inner electrodes 12 facing downward towards the piezoelectric ceramic sheet 11a. The stacked piezoelectric ceramic sheets 11 are bonded by thermocompression, cut into a predetermined shape, and fired at a temperature of about 1,200° C. In this way, the piezoelectric layered member 13 is manufactured.

Subsequently, silver is plated onto the inner electrodes 12 exposed at the edges of the piezoelectric ceramic sheets 11 such that the inner electrodes 12 are joined together to form the external electrodes 17.

Finally, a direct-current (DC) high voltage is applied between the opposing inner electrodes 12 to polarize and piezoelectrically activate the piezoelectric ceramic sheets 11.

Now, the operation of the piezoelectric layered member 13, manufactured by the above-described process, will be described.

Figure 5:
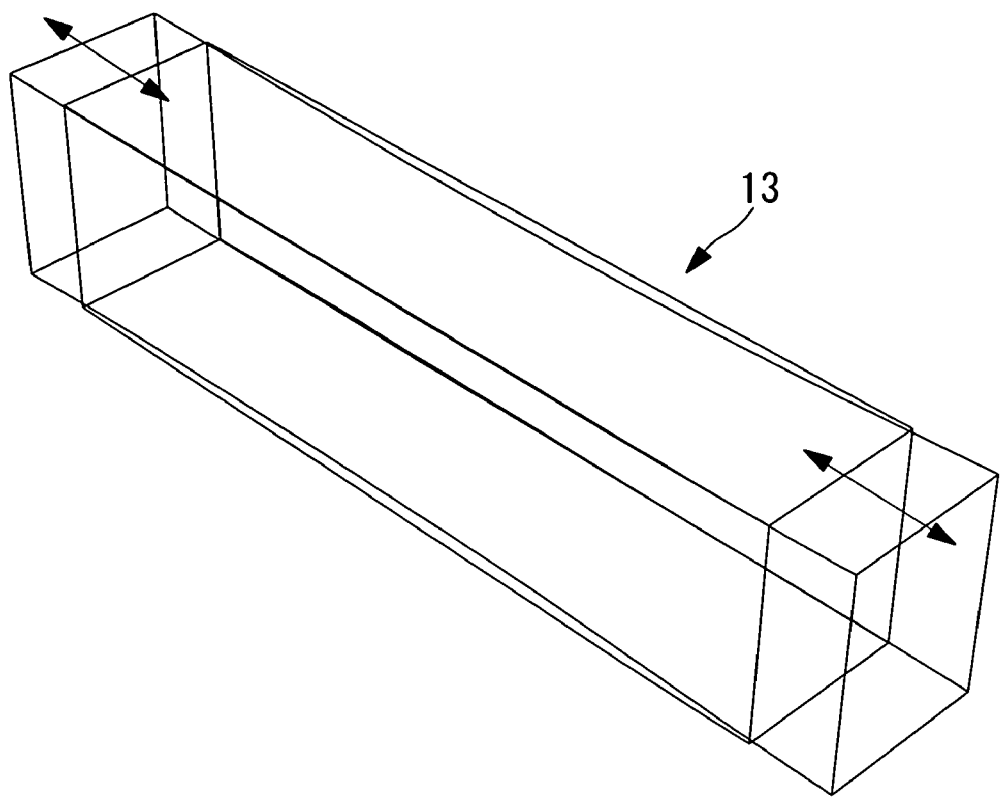
FIG. 5 is a diagram illustrating a computer analysis of the vibration of the piezoelectric layered member in FIG. 2 in a first-order longitudinal mode.
Figure 6:
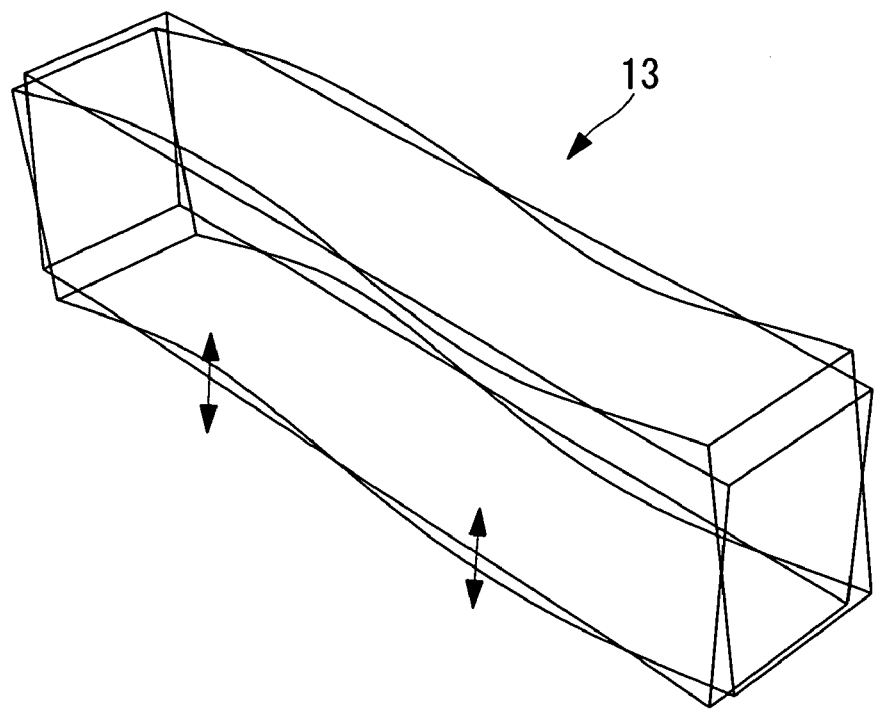
FIG. 6 is a diagram illustrating a computer analysis of the vibration of the piezoelectric layered member in FIG. 2 in a second-order flexural vibration.

The two external electrodes 17 that are provided on a first longitudinal end of the piezoelectric layered member 13 are defined as A-phase (A+ and A−) external electrodes 17, and the two external electrodes 17 that are provided on a second longitudinal end of the piezoelectric layered member 13 correspond to B-phase (B+ and B−) external electrodes 17. By applying alternating-current (AC) voltages corresponding to resonant frequencies and having synchronous phases to the A-phase and B-phase external electrodes 17, the piezoelectric layered member 13 is excited and a first-order longitudinal vibration is generated, as illustrated in FIG. 5. By applying AC voltages corresponding to resonant frequencies and having opposite phases to the A-phase and B-phase external electrodes 17, the piezoelectric layered member 13 is excited and a second-order flexural vibration is generated, as illustrated in FIG. 6. FIGS. 5 and 6 illustrate the results of a computer analysis based on a finite element method.

The first friction-contact members 14 are bonded on the piezoelectric layered member 13 at two positions corresponding to the antinodes of the second-order flexural vibration. The second friction-contact member 14a is bonded substantially at the center of the two first friction-contact members 14 in the longitudinal direction of the piezoelectric layered member 13. In this way, the first friction-contact members 14 are displaced in the longitudinal direction of the piezoelectric layered member 13 (that is, the X direction in FIG. 2) when a first-order longitudinal vibration is generated in the piezoelectric layered member 13, and the second friction-contact member 14a is not displaced in the longitudinal direction.

On the other hand, the first friction-contact members 14 are displaced in the width direction of the piezoelectric layered member 13 (that is, the Z direction in FIG. 2) when a second-order flexural vibration is generated in the piezoelectric layered member 13, and the second friction-contact member 14a oscillates at substantially that position.

Figure 2:
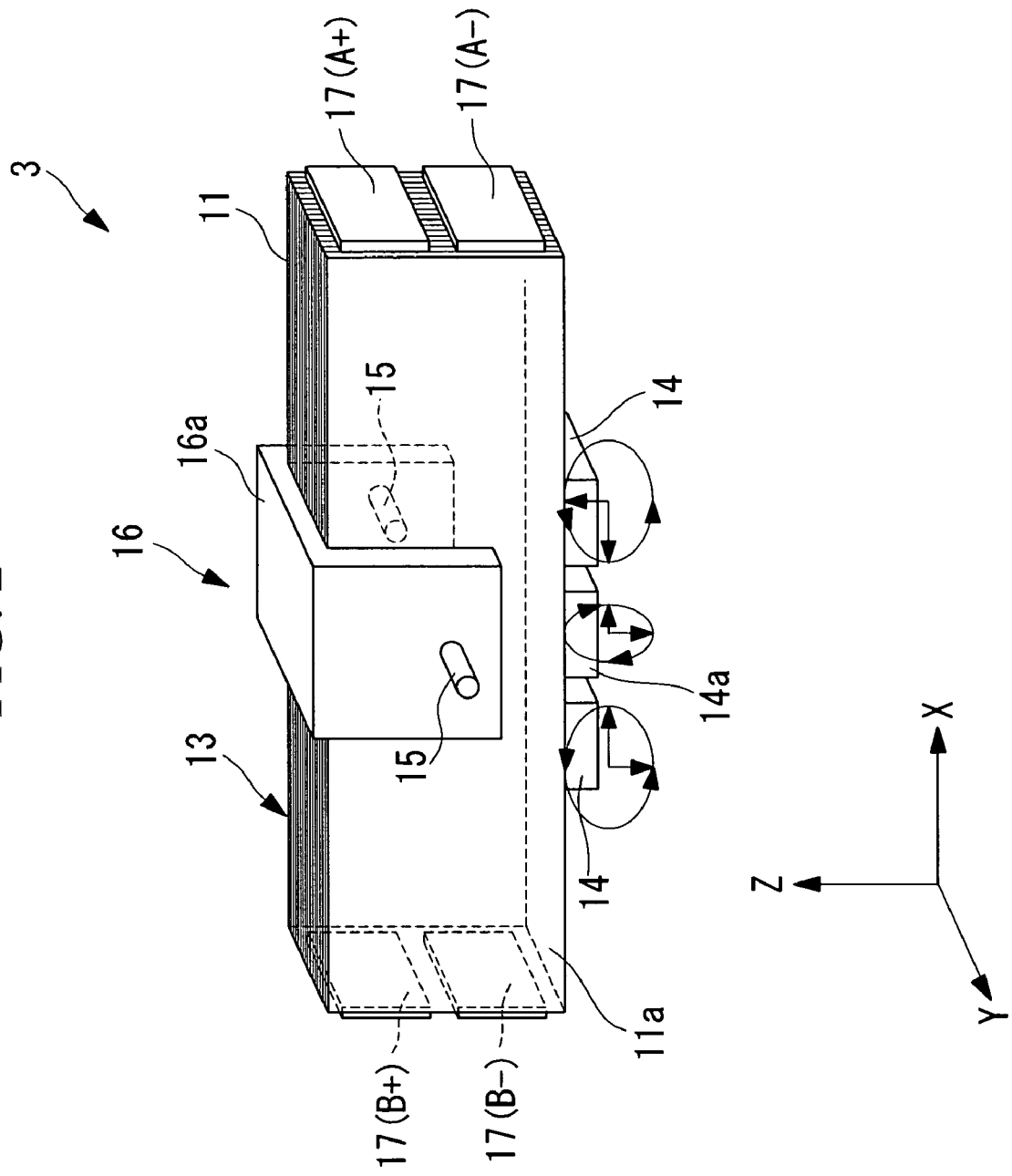
FIG. 2 is a perspective view showing an ultrasonic vibrator in the ultrasonic motor in FIG. 1.

Consequently, by applying 90-degree phase-shifted alternating-current voltages corresponding to the resonant frequencies to the A-phase and B-phase external electrodes 17 of the ultrasonic vibrator 3, the first-order longitudinal vibration and the second-order flexural vibration are generated simultaneously. As a result, a substantially circular vibration or a substantially elliptic vibration in a clockwise or counterclockwise direction is generated at the first friction-contact members 14 and the second friction-contact member 14a, as indicated in FIG. 2.

In this embodiment, the first friction-contact members 14 have a phase difference of 180 degrees therebetween, and there is a phase difference of 90 degrees between the second friction-contact member 14a and the first friction contact members 14. On the other hand, the locii of the first friction-contact members 14 and the locus of the second friction-contact member 14a are in opposite directions temporally. Also, the ratio of the amplitude of the longitudinal vibrations of the first friction-contact members 14 to that of the second friction-contact member 14a is about 4:1, and the ratio of the amplitude of the flexural vibrations of the first friction-contact members 14 to that of the second friction-contact-member 14a is about 2:1.

The vibrator holding member 16 includes a holding part 16a having a substantially angular-U shape in cross section and the pins 15, integral with the holding part 16a, which project perpendicularly from both sides of the holding part 16a. The holding part 16a covers the piezoelectric layered member 13 from one side in the width direction thereof and is bonded to the piezoelectric layered member 13 with, for example, a silicone resin or an epoxy resin. When the holding part 16a is bonded to the piezoelectric layered member 13, the two pins 15 integrally provided on the sides of the holding part 16a are coaxially disposed at the position of a common node of the longitudinal vibration and the flexural vibration of the piezoelectric layered member 13.

The pressing unit 4, as illustrated in FIG. 1, includes a bracket 18, a pressing unit 19, a coil spring 20, an adjustment screw 21, and guiding bushes 22. The bracket 18 is fixed on the base 5 with screws 23 at a position a predetermined distance away from the ultrasonic vibrator 3 in the width direction (Z direction) on the opposite side of the ultrasonic vibrator 3 from the friction-contact members 14. The pressing unit 19 is supported so that it is movable in the width direction of the ultrasonic vibrator 3 with respect to the bracket 18. The coil spring 20 applies a pressing force to the pressing unit 19, and the adjustment screw 21 adjusts the pressing force. The guiding bushes 22 guide the movement of the pressing unit 19 with respect to the bracket 18.

The pressing unit 19 includes two support plates 24 sandwiching the ultrasonic vibrator 3 in the thickness direction thereof. The support plates 24 each have a through-hole 25 for passing the pins 15 of the vibrator holding member 16. The pressing force applied to the pressing unit 19 is transmitted to the ultrasonic vibrator 3 through the support plates 24 and the pins 15 passing through the through-holes 25.

The coil spring 20 is a compression coil spring interposed between the adjustment screw 21 and the pressing unit 19. By changing the fastening position of the adjustment screw 21 with respect to the bracket 18, the amount of elastic deformation of the coil spring 20 is changed so as to change the pressing force applied to the pressing unit 19 in a direction toward the ultrasonic vibrator 3.

Now, the operation of the ultrasonic motor 1 according to this embodiment, having the above-described structure, will be described below.

To operate the ultrasonic motor 1 according to this embodiment, high-frequency voltages (A-phase and B-phase) having a phase difference of 90 degrees are supplied to the A-phase and B-phase external electrodes 17 via the wires connected to the external electrodes 17.

In this way, a substantially elliptic vibration, which is a combination of the longitudinal vibration mode and the flexural vibration mode, is generated in one direction (the counterclockwise direction in FIG. 2) at the first friction-contact members 14 bonded to the ultrasonic vibrator 3. The driven body 2 is driven by the frictional force generated between the ultrasonic vibrator 3 and the sliding plate 8 of the driven body 2 in the tangential direction of the elliptic vibration. At this time, the second friction-contact member 14a bonded to the ultrasonic vibrator 3 exhibits substantially elliptical vibration in the opposite direction to the first friction-contact members 14 (the clockwise direction in FIG. 2), and a frictional force is generated between the ultrasonic vibrator 3 and the sliding plate 8 of the driven body 2 in the tangential direction of the elliptical vibration, thus applying a damping force to the driven body 2 driven by the first friction-contact members 14.

With the ultrasonic motor 1 according to this embodiment, the second friction-contact member 14a bonded to the ultrasonic vibrator 3 vibrates substantially elliptically in the direction opposite to the first friction-contact members 14, and a damping force is applied to the driven body 2 driven by the first friction-contact members 14 due to the frictional force produced between ultrasonic vibrator 3 and the sliding plate 8 of the driven body 2 in a direction tangential to the elliptical vibration. Therefore, the ultrasonic motor 1 can finely (that is, minutely) adjust the amount of movement (translation) of the driven body 2.

At this time, since the vibration of the ultrasonic vibrator 3, which is resonating, is not restricted, an advantage is afforded in that it is possible to finely and stably move the driven body 2 without the substantially elliptical vibrations at the friction-contact members 14 and 14a becoming unstable.

Next, an ultrasonic motor 2 according to a second embodiment of the present invention will be described using FIG. 7.

Figure 7:
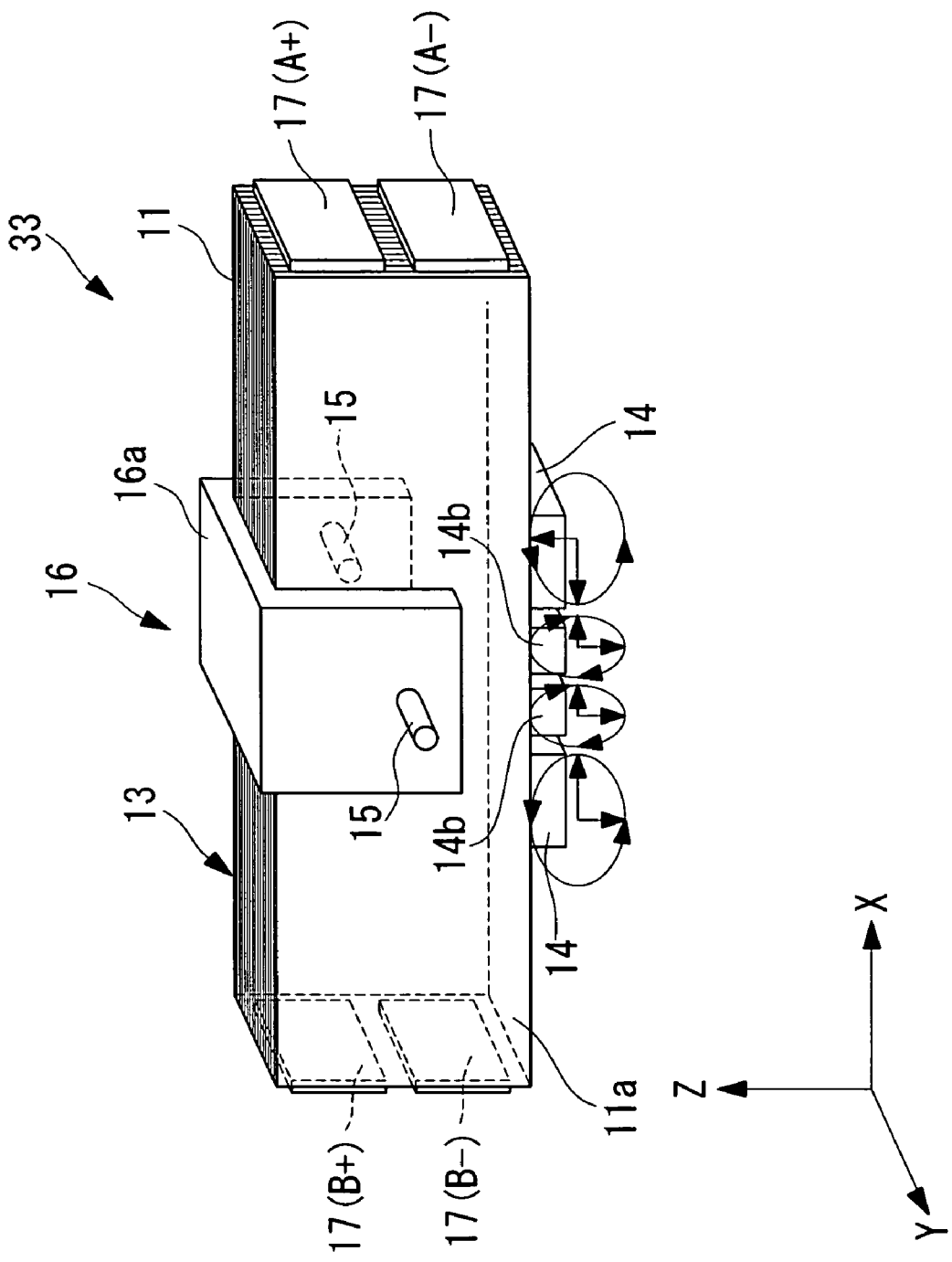
FIG. 7 is a perspective view showing an ultrasonic vibrator in an ultrasonic motor according to a second embodiment of the present invention.

As shown in FIG. 7, the ultrasonic motor 2 according to this embodiment differs from that in the first embodiment described above in that an ultrasonic vibrator 33 having two second friction-contact members 14b between the first friction-contact members 14 is provided. The other elements are identical to those in the first embodiment described above, and therefore, a description of those elements shall be omitted here.

Parts identical to those in the first embodiment are assigned the same reference numerals.

In this embodiment, the first friction-contact members 14 have a phase difference of 180 degrees, and the second friction-contact members 14b have substantially the same phase. The second friction-contact members 14b have phase differences of 90 degrees with respect to the first friction-contact members 14. On the other hand, the locii of the first friction-contact members 14 and the locii of the second friction-contact members 14b are in opposite directions, temporally. Also, the ratio of the amplitude of the longitudinal vibrations of the first friction-contact members 14 to that of the second friction-contact members 14b is about 4:1, and the ratio of the amplitude the flexural vibrations of the first friction-contact members 14 to that of the second friction-contact-members 14b is about 2:1.

With the ultrasonic motor according to this embodiment, the contact area between the second friction-contact members 14b and the sliding plate 8 of the driven body 2 is smaller than that in the first embodiment described above, and therefore, a damping force applied to the driven body 2 is reduced, which allows the amount of movement of the driven body 2 to be increased compared to that in the first embodiment.

The other effects and advantages are the same as in the first embodiment described above, and a description thereof shall thus be omitted here.

Next, an ultrasonic motor according to a third embodiment of the present invention will be described using FIG. 8.

Figure 8:
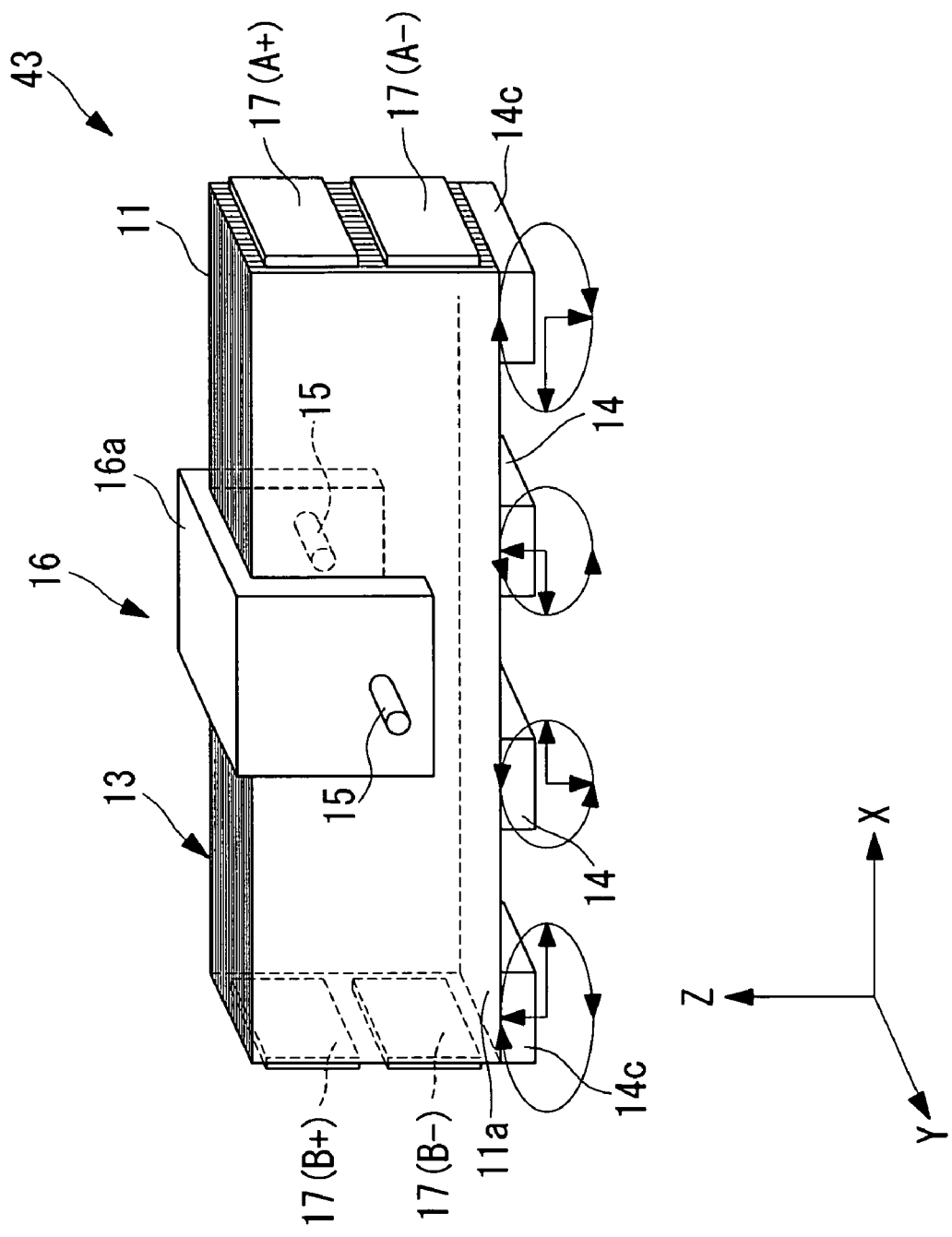
FIG. 8 is a perspective view showing an ultrasonic vibrator in an ultrasonic motor according to a third embodiment of the present invention.

As shown in FIG. 8, the ultrasonic motor according to this embodiment differs from that in the embodiments described above in that an ultrasonic vibrator 43 having first friction-contact members 14 and third friction-contact members (output terminals) 14c is provided. The other elements are identical to those in the embodiments described above, and therefore, a description of those elements shall be omitted here.

Parts identical to those in the embodiments described above are assigned the same reference numerals.

The first friction-contact members 14 have been described in the first embodiment, and the description thereof shall not be repeated here.

The third friction-contact members 14c are bonded to the piezoelectric layered member 13 at the two ends in the longitudinal direction (the X direction in FIG. 8). When a first-order longitudinal vibration is generated in the piezoelectric layered member 13, the piezoelectric layered member 13 can be made to shift in the longitudinal direction, and when a second-order flexural vibration is generated in the piezoelectric layered member 13, the piezoelectric layered member 13 can be made to shift in the width direction (the Z direction in FIG. 8).

In this embodiment, the first friction-contact members 14 have a phase difference of 180 degrees, and the third friction-contact members 14c also have a phase difference of 180 degrees. On the other hand, the locii of the first friction-contact members 14 and the third friction-contact members 14c are in opposite directions, temporally. Also, the ratio of the amplitude of the longitudinal vibrations of the first friction-contact members 14 to that of the third friction-contact members 14c is about 1:2, and the ratio of the amplitude the flexural vibrations of the first friction-contact members 14 to that of the third friction-contact-members 14c is about 1:1.

The operation of the ultrasonic motor according to this embodiment, having such a configuration, will now be described.

To operate the ultrasonic motor according to this embodiment, high-frequency voltages having phases differing by 90 degrees (A phase and B phase) are supplied via wiring lines connected to the external electrodes 17.

Accordingly, substantially elliptical vibrations in one direction (the clockwise direction in FIG. 8), produced by combining the longitudinal vibration mode and the flexural vibration mode, are generated at the third friction-contact members 14c bonded to the ultrasonic vibrator 43. The driven body 2 is driven by the frictional force produced between the ultrasonic vibrator 43 and the sliding plate 8 of the driven body 2 in a direction tangential to the elliptical vibrations. At this time, the first friction-contact members 14 bonded to the ultrasonic vibrator 43 vibrate substantially elliptically in the opposite direction to the third friction-contact members 14c (the counterclockwise direction in FIG. 8). As a result, a damping force is applied to the driven body 2 driven by the third friction-contact members 14c due to the frictional force produced between the ultrasonic vibrator 43 and the sliding plate 8 of the driven body 2 in a direction tangential to the elliptical vibrations.

With the ultrasonic motor according to this embodiment, because the driven body 2 is driven by the third friction-contact members 14c provided at both ends of the piezoelectric layered member 13 in the longitudinal direction thereof, the amount of movement of the driven body 2 can be increased compared to that in the first and second embodiments.

Furthermore, the first friction-contact members 14 bonded to the ultrasonic vibrator 43 vibrate substantially elliptically in the opposite direction to the third friction-contact members 14c, which allows a damping force to be applied to the driven body 2 driven by the third friction-contact members 14c due to the frictional force produced between the ultrasonic vibrator 43 and the sliding plate 8 of the driven body 2 in a direction tangential to the elliptical vibrations. Therefore, the ultrasonic motor 1 can finely (that is, minutely) adjust the amount of movement (translation) of the driven body 2.

An ultrasonic motor according to a fourth embodiment of the present invention will now be described with reference to FIGS. 9 and 10.

Figure 9:
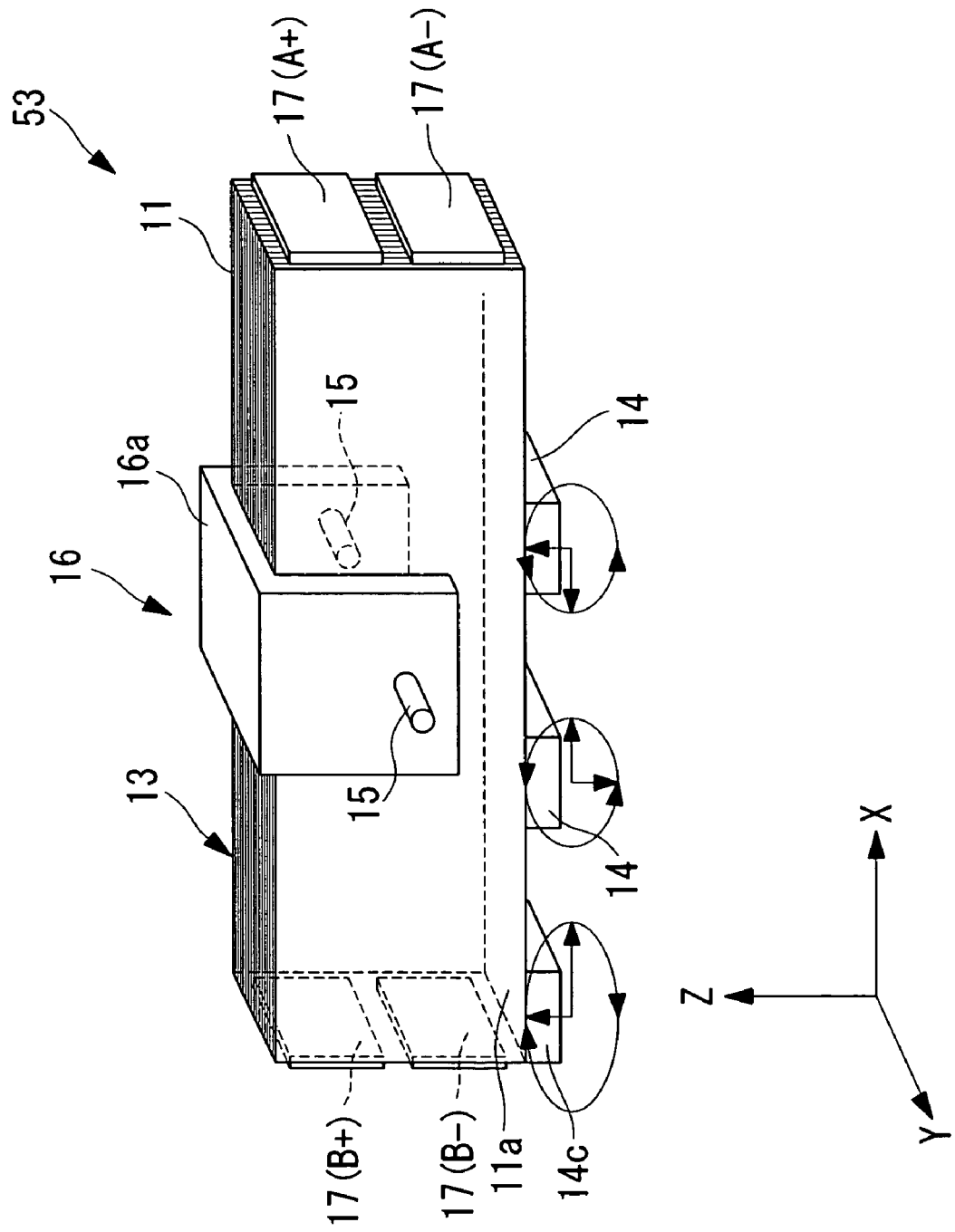
FIG. 9 is a perspective view showing an ultrasonic vibrator in an ultrasonic motor according to a fourth embodiment of the present invention.
Figure 10:
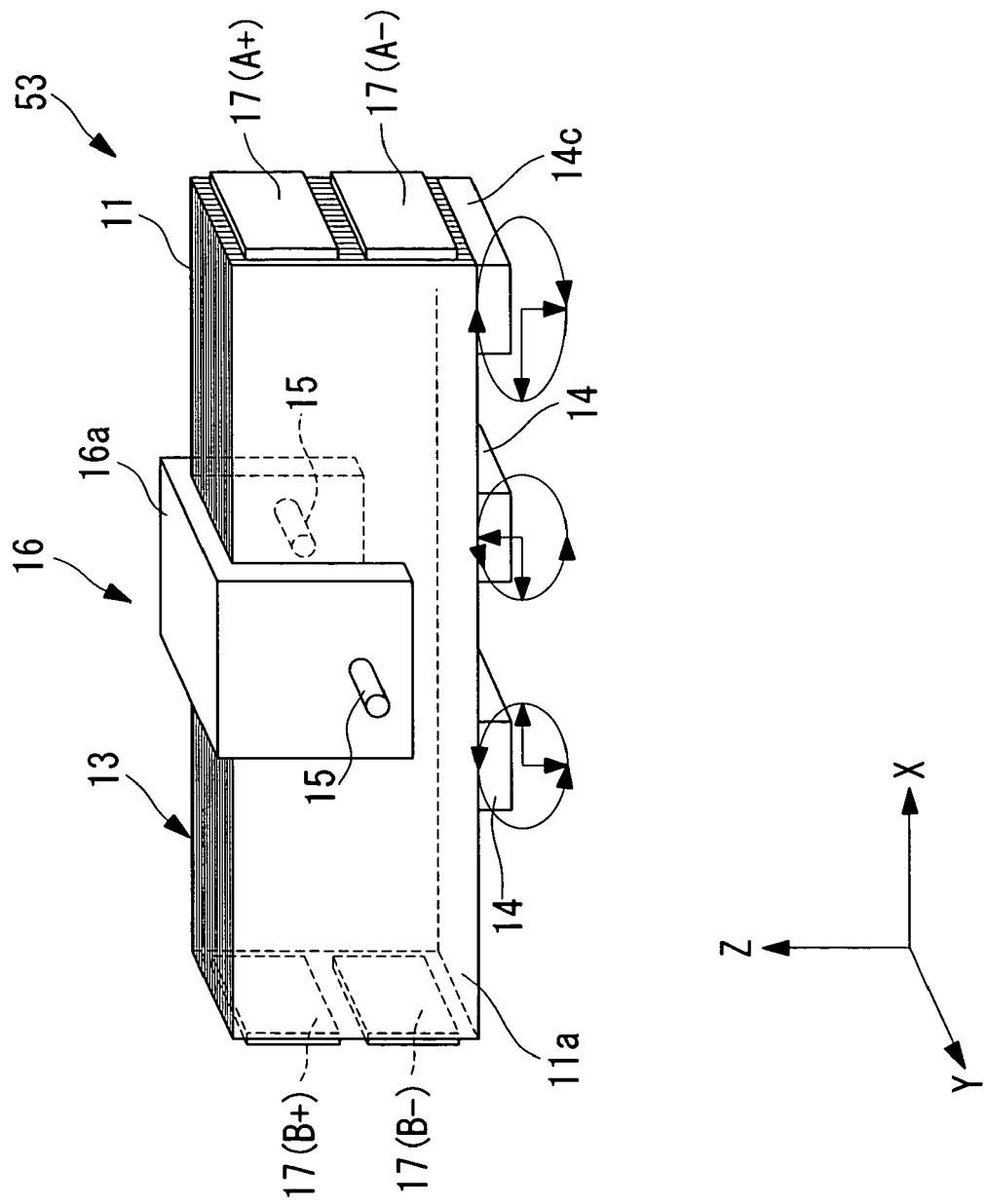
FIG. 10 is a perspective view showing an ultrasonic vibrator in an ultrasonic motor according to a fifth embodiment of the present invention.

As shown in FIGS. 9 and 10, the ultrasonic motor according to this embodiment differs from that in the third embodiment described above in that an ultrasonic vibrator 53 is provided; one of the third friction-contact members 14c disposed at both ends of the piezoelectric layered member 13 in the longitudinal direction is omitted from the ultrasonic vibrator 53. The other elements are identical to those in the third embodiment described above, and a description of those elements shall thus be omitted here.

Parts identical to those in the embodiments described above are assigned the same reference numerals.

With the ultrasonic motor according to this embodiment, the damping force due to the first friction-contact members 14 remains the same, but the driving force due to the third friction-contact member 14c is reduced. Therefore, the amount of movement (translation) of the driven body 2 can be adjusted more finely (that is, more minutely) compared to the third embodiment.

The present invention is not limited to the embodiments described above. In order to obtain the desired amount of movement, the positions, sizes, materials, and so on of the friction-contact members can be changed as required.

In the above-described embodiments, PZT was used for the piezoelectric ceramic sheets. However, the piezoelectric ceramic sheets are not limited to PZT, and any other material may be used so long as it exhibits piezoelectricity.

Furthermore, although silver-palladium alloy was used as the material constituting the inner electrodes, silver, nickel, platinum, or gold may be used instead.

Moreover, instead of bonding a sliding plate composed of zirconia ceramic on the surface of the driven body 2, zirconia ceramic may be applied to the surface of the driven body 2 by sputtering.

Furthermore, as shown in FIG. 11, it is possible to form an ultrasonic vibrator 63 by combining the second friction-contact member 14a described in the first embodiment and the third friction-contact members 14c described in the third embodiment.

In this embodiment, the third friction-contact members 14c have a phase difference of 180 degrees, and the second friction-contact member 14a has phase differences of 90 degrees with respect to the third friction-contact members 14c. On the other hand, the locus of the second friction-contact member 14a and the locus of the third friction-contact members 14c are in opposite directions, temporally. Also, the ratio of the amplitude of the longitudinal vibrations of the second friction-contact member 14a to that of the third friction-contact members 14c is about 1:5, and the ratio of the amplitude of the flexural vibrations of the second friction-contact member 14a to that of the third friction-contact-members 14c is about 1:2.

With the ultrasonic motor according to this embodiment, the second friction-contact member 14a and the third friction-contact members 14c bonded to the ultrasonic vibrator 3 vibrate substantially elliptically in the same direction. The driven body 2 is driven by the frictional force produced between the ultrasonic vibrator 63 and the sliding plate 8 of the driven body 2 in a direction tangential to the elliptical vibrations. That is to say, because only a driving force is applied to the driven body 2, it is possible to significantly increase the amount of motion (translation) of the driven body 2.

What is claimed is:

1. An ultrasonic motor comprising:
   an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and
   a pressing unit for pressing the output terminals of the ultrasonic vibrator against a driven body,
   wherein the output terminals include first friction-contact members disposed at positions substantially corresponding to antinodes of a flexural vibration and a second friction-contact member disposed substantially at the center in the longitudinal direction of the ultrasonic vibrator, and the first friction-contact members and the second friction-contact member are disposed on the same side surface of the electromechanical transducer opposing the driven body.

2. An ultrasonic motor comprising:
   an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and
   a pressing unit for pressing the output terminals of the ultrasonic vibrator against a driven body,
   wherein the output terminals include first friction-contact members disposed at positions substantially corresponding to antinodes of a flexural vibration and third friction-contact members disposed at two ends in the longitudinal direction of the ultrasonic vibrator, and the first friction-contact members and the third friction-contact members are disposed on the same side surface of the electromechanical transducer opposing the driven body.

3. An ultrasonic motor comprising:
   an ultrasonic vibrator which includes an electromechanical transducer and which is configured to simultaneously generate two different vibration modes to produce substantially elliptical vibrations at output terminals by supplying two sets of alternating-current voltages with a predetermined phase difference and a predetermined driving frequency to the electromechanical transducer; and
   a pressing unit for pressing the output terminals of the ultrasonic vibrator against a driven body, wherein the output terminals include first friction-contact members disposed at positions substantially corresponding to antinodes of a flexural vibration and a third friction-contact member disposed at one end in the longitudinal direction of the ultrasonic vibrator, and the first friction-contact members and the third friction-contact member are disposed on the same side surface of the electromechanical transducer opposing the driven body.

* * * * *